(12) United States Patent
Michioka

(10) Patent No.: US 11,283,447 B2
(45) Date of Patent: Mar. 22, 2022

(54) IMPEDANCE CALIBRATION CIRCUIT

(71) Applicant: Winbond Electronics Corp., Taichung (TW)

(72) Inventor: Yoshihisa Michioka, Kanagawa (JP)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 17/235,873

(22) Filed: Apr. 20, 2021

(65) Prior Publication Data

US 2021/0367597 A1 Nov. 25, 2021

(30) Foreign Application Priority Data

May 25, 2020 (JP) .............................. JP2020-090258

(51) Int. Cl.
*H03K 19/00* (2006.01)
*G11C 7/10* (2006.01)

(52) U.S. Cl.
CPC ....... *H03K 19/0005* (2013.01); *G11C 7/1048* (2013.01)

(58) Field of Classification Search
CPC .............. H03K 19/0005; G11C 7/1084; G11C 29/028; G11C 7/1057
USPC ........................................................ 326/30
See application file for complete search history.

(56) References Cited

U.S. PATENT DOCUMENTS

| 8,384,423 | B2 | 2/2013 | Nguyen et al. | |
|---|---|---|---|---|
| 9,369,128 | B1* | 6/2016 | Tan | H04L 25/028 |
| 9,559,691 | B1* | 1/2017 | Kim | H03K 19/0005 |
| 9,563,213 | B2 | 2/2017 | Addepalli et al. | |
| 2006/0114140 | A1 | 6/2006 | Hsueh | |
| 2007/0182453 | A1 | 8/2007 | Lee | |
| 2014/0002130 | A1* | 1/2014 | Jang | H03K 17/16 326/30 |
| 2014/0097911 | A1* | 4/2014 | Kaiwa | G01R 19/0084 333/17.3 |
| 2014/0167281 | A1* | 6/2014 | Byeon | H01L 25/0657 257/774 |
| 2015/0091611 | A1* | 4/2015 | Jeong | G11C 29/022 326/30 |

(Continued)

OTHER PUBLICATIONS

"Office Action of Korea Counterpart Application", dated May 27, 2021, with English translation thereof, p. 1-p. 15.

*Primary Examiner* — Don P Le
(74) *Attorney, Agent, or Firm* — JCIPRNET

(57) ABSTRACT

An impedance calibration circuit includes first and second calibration circuits, a switch circuit and a control circuit. The first calibration circuit is coupled to an external resistance, and generates a first voltage. The second calibration circuit generates second and third voltages. The switch circuit is coupled to the first and second calibration circuits. The switch circuit selectively provides the first, second, and third voltages to first and second nodes. The control circuit is coupled to the first and second nodes. The control circuit generates first, second, and third control signals according to voltages of the first and second nodes. In a first time interval, the switch circuit provides the first voltage to the first and second nodes. In a second time interval, the switch circuit provides the second voltage to the first and second nodes, or provides the second and third voltages respectively to the first and second nodes.

14 Claims, 10 Drawing Sheets

(56) References Cited

U.S. PATENT DOCUMENTS

2017/0331476 A1* 11/2017 Cho .................... G11C 7/1057
2021/0367596 A1* 11/2021 Michioka ........... H03K 19/0005

* cited by examiner

IMPEDANCE CALIBRATION CIRCUIT

CROSS-REFERENCE TO RELATED APPLICATION

This application claims the priority benefit of Japan application serial no. 2020-090258, filed on May 25, 2020. The entirety of the above-mentioned patent application is hereby incorporated by reference herein and made a part of this specification.

BACKGROUND

Technical Field

The disclosure relates to a circuit, and in particular to an impedance calibration circuit.

Description of Related Art

In the conventional technology, when performing an impedance calibration of a memory (such as ZQ calibration), the memory can only be calibrated by using limited cycles to calibrate an internal impedance value of the memory to be close to a predetermined impedance. However, results obtained from calibration performed within limited cycles usually are insufficient in accuracy and contain a considerable error with regard to the impedance value. Therefore, the internal impedance of a memory device may fall out of specification.

SUMMARY

The disclosure provides an impedance calibration circuit which performs impedance calibration for a memory device.

An impedance calibration circuit of the disclosure includes a first calibration circuit, a second calibration circuit, a switch circuit, and a control circuit. The first calibration circuit is adapted to be coupled to an external resistance through a pad, and generates a first voltage according to a first control signal. The second calibration circuit generates a second voltage and a third voltage according to the first control signal, a second control signal, and a third control signal. The switch circuit is coupled to the first calibration circuit and the second calibration circuit. The switch circuit selectively provides the first voltage, the second voltage, and the third voltage to a first node and a second node. The control circuit is coupled to the switch circuit at the first node and the second node. The control circuit performs comparisons of a voltage of the first node and a voltage of the second node respectively with a first reference signal and a second reference signal. The control circuit generates the first control signal, the second control signal, and the third control signal according to comparison results. In a first time interval, the switch circuit provides the first voltage to the first node and the second node. In a second time interval, the switch circuit provides the second voltage to the first node and the second node, or provides the second voltage and the third voltage respectively to the first node and the second node.

Based on the foregoing, the impedance calibration circuit of the disclosure can perform a plurality of comparison operations at the same time, which effectively reduces the time required for the impedance calibration and increases the accuracy of the impedance calibration.

DESCRIPTION OF THE EMBODIMENTS

Figure 1A:
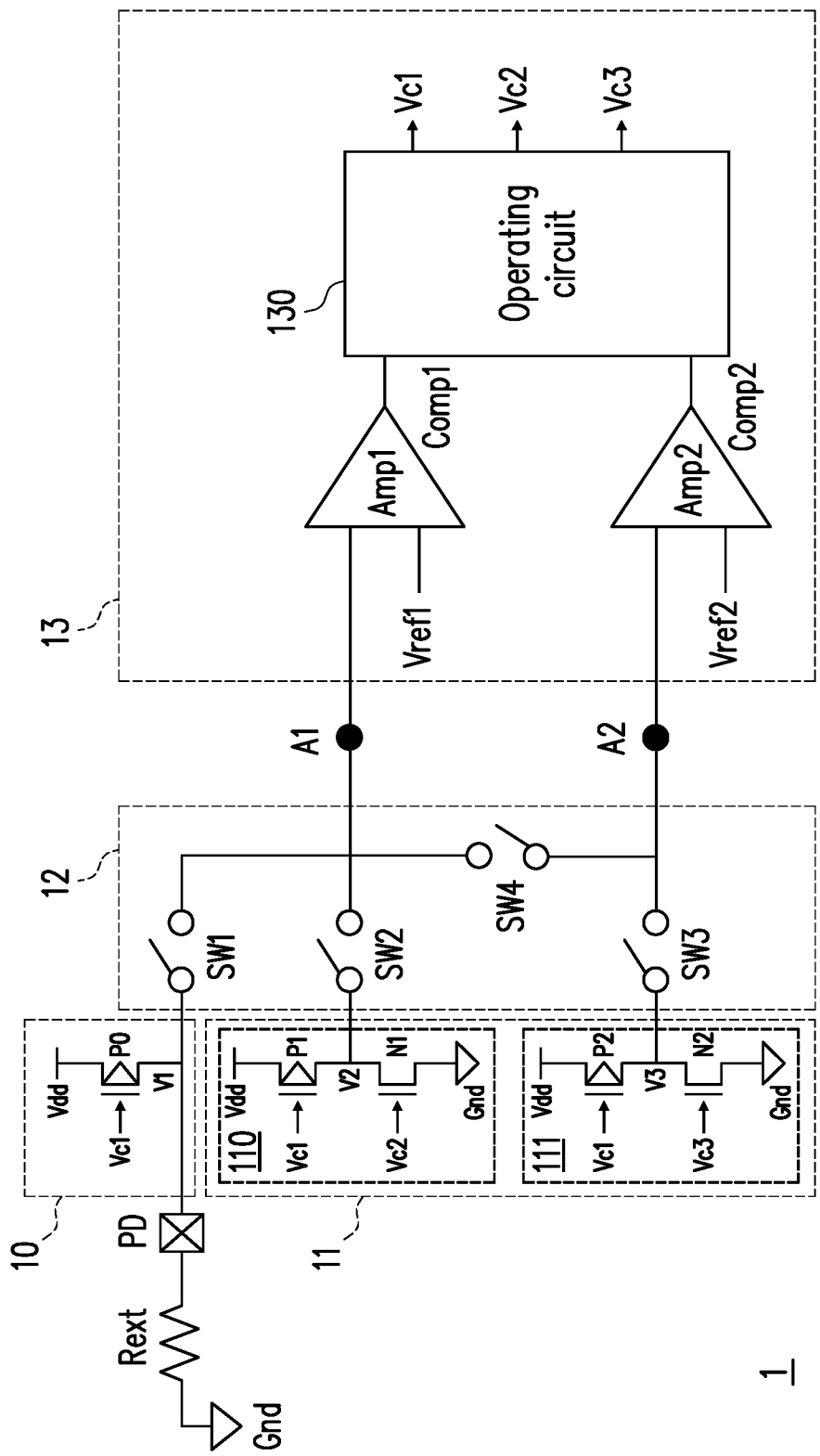
FIG. 1A is a schematic diagram of an impedance calibration circuit according to an embodiment of the disclosure.

FIG. 1A is a schematic diagram of an impedance calibration circuit 1 according to an embodiment of the disclosure. The impedance calibration circuit 1 includes a calibration circuit 10, a calibration circuit 11, a switch circuit 12, and a control circuit 13. The calibration circuit 10 is coupled to an external resistance Rext through a pad PD, and receives a control signal Vc1 to adjust an impedance value of the calibration circuit 10. The calibration circuit 10 may therefore be biased with the external resistance Rext to generate a voltage V1. The voltage V1 is transmitted to the control circuit 13 through the switch circuit 12, and the control circuit 13 adjusts the control signal Vc1 transmitted to the calibration circuit 10 accordingly to adjust the impedance value of the calibration circuit 10. The calibration circuit 11 receives the control signals Vc1, Vc2, and Vc3 to adjust an impedance value of the calibration circuit 11, so that the calibration circuit 11 is biased according to the calibrated control signal Vc1 to generate voltages V2 and V3. The control circuit 13 adjusts the control signals Vc2 and Vc3 transmitted to the calibration circuit 11 accordingly to adjust the impedance value of the calibration circuit 11. Further, a plurality of comparison operations may be performed in the control circuit 13 at the same time to reduce the impedance calibration time of the impedance calibration circuit 1.

In detail, the calibration circuit 10 includes a transistor P0. One terminal of the transistor P0 receives an operating voltage Vdd and another terminal is coupled to the pad PD. A control terminal of the transistor P0 receives the control signal Vc1 to adjust an impedance value of the transistor P0. Therefore, the transistor P0 adjusts the impedance value thereof according to the control signal Vc1, and generates the corresponding voltage V1 after being biased with the external resistance Rext.

The calibration circuit 11 includes bias circuits 110 and 111. The bias circuit 110 receives the control signals Vc1 and Vc2 to generate the voltage V2. The bias circuit 111 receives the control signals Vc1 and Vc3 to generate the voltage V3. The bias circuit 110 has transistors P1 and N1. One terminal of the transistor P1 receives the operating voltage Vdd and another terminal is coupled to one terminal of the transistor N1. Another terminal of the transistor N1 receives a ground voltage Gnd. Control terminals of the transistors P1 and N1 respectively receive the control signals Vc1 and Vc2 to adjust impedance values of the transistors P1 and N1. The bias circuit 111 has transistors P2 and N2. One terminal of the transistor P2 receives the operating voltage Vdd and another terminal is coupled to one terminal of the transistor N2, and another terminal of the transistor N2 receives the ground voltage Gnd. Control terminals of the transistors P2 and N2 respectively receive the control signals Vc1 and Vc3 to adjust impedance values of the transistors P2 and N2. Therefore, the transistors P1 and N1 in the bias circuit 110 adjust the respective impedance values thereof according to the control signals Vc1 and Vc2, to be biased at the node where the transistors P1 and N1 are coupled to generate the voltage V2. The transistors P2 and N2 in the bias circuit 111 adjust the respective impedance values thereof according to the control signals Vc1 and Vc3, to be biased at the node where the transistors P2 and N2 are coupled to generate the voltage V3.

The switch circuit 12 has switches SW1 to SW4. The switch circuit 12 selectively provides the voltages V1 to V3 to nodes A1 and A2. The switch SW1 is coupled between the calibration circuit 10 and the node A1. The switch SW2 is coupled between the bias circuit 110 in the calibration circuit 11 and the node A1. The switch SW3 is coupled between the bias circuit 111 in the calibration circuit 11 and the node A2. The switch SW4 is coupled between the node A1 and the node A2.

The control circuit 13 includes comparators Amp1 and Amp2, and an operating circuit 130. In the comparator Amp1, one input terminal is coupled to the node A1, another input terminal receives a reference signal Vref1, and a comparison result Comp1 of the two input terminals is generated at an output terminal. In the comparator Amp2, one input terminal is coupled to the node A2, another input terminal receives a reference signal Vref2, and a comparison result Comp2 of the two input terminals is generated at an output terminal. The operating circuit 130 is coupled to the comparators Amp1 and Amp2, receives the comparison results Comp1 and Comp2, and generates the control signals Vc1, Vc2, and Vc3 accordingly.

The control signals Vc1, Vc2, and Vc3, and the operating circuit 130 may be adapted based on the specific implementation of the calibration circuits 10 and 11 to realize the signal types of the control signals Vc1, Vc2, and Vc3 in a corresponding manner. In an embodiment, when the transistors P0, P1, P2, N1, and N2 in the calibration circuits 10 and 11 may receive analog control signals Vc1, Vc2, and Vc3, the operating circuit 130 may include a digital-to-analog converter (DAC) to convert a computed digital signal into an analog signal, so that the transistors P0, P1, P2, N1, and N2 in the calibration circuits 10 and 11 may be adjusted. In another embodiment, the transistors P0, P1, P2, N1, and N2 may include a plurality of transistors connected in parallel. The parallel-connected transistors may be devised to have a same or different sizes, and a same or different current driving capabilities. Accordingly, the operating circuit 130 may provide the control signals Vc1, Vc2, and Vc3 in corresponding coding forms to the transistors P0, P1, P2, N1, and N2 in a bit order. For instance, the control signals Vc1, Vc2, and Vc3 may be a one-hot, a thermometer code, a binary form, or other appropriate digital coding forms. Therefore, the disclosure does not limit the signal types of the control signals Vc1, Vc2, and Vc3.

Figure 1B:
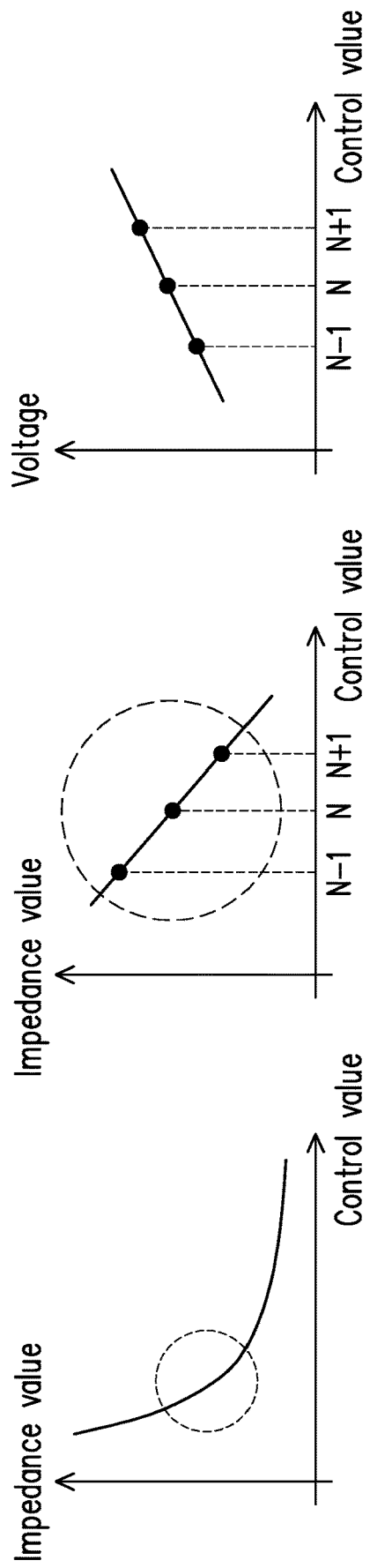
FIG. 1B includes diagrams showing the relationship between an impedance value of the calibration circuit and a voltage of a control signal according to an embodiment of the disclosure.

FIG. 1B includes diagrams showing the relationship between the impedance value of the calibration circuit 10 and the voltage of the control signal Vc1 according to an embodiment of the disclosure. When the transistor P0 may receive the analog control signal Vc1, the operating circuit 130 converts a binary value of the control signal Vc1 into an analog voltage value to be provided to the transistor P0, so that the transistor P0 generates a corresponding impedance value. Referring to the left part of FIG. 1B, a diagram of the relationship between the impedance value of transistor P0 and the control signal Vc1 is shown, where the vertical axis represents the impedance value of the transistor P0 and the horizontal axis represents a control value of the control signal Vc1. The control value of the control signal Vc1 may be converted by a DAC to generate an analog voltage to control the transistor P0. When the control value of the control signal Vc1 is low, the impedance of the transistor P0 is high. As the control value of the control signal Vc1 increases, the impedance of the transistor P0 decreases in a nonlinear manner.

Referring to the middle part of FIG. 1B, an enlarged schematic view of a portion within a dashed circle at the left part of FIG. 1B is shown. Since the voltage value of the control signal Vc1 is converted from digital signals, the control value of the control signal Vc1 is discretely distributed. When the control value of the control signal Vc1 is N−1, N, or N+1, a converted corresponding voltage value is provided to the transistor P0, so that the transistor P0 may generate a corresponding impedance value.

Referring to the right part of FIG. 1B, a diagram of the relationship between the voltage V2 generated by the calibration circuit 10 and the control value of the control signal Vc1 is shown. It can be known as shown in the middle part of FIG. 1B that as the control value of the control signal Vc1 increases (i.e., the voltage of the control signal Vc1 increases), the impedance of the transistor P0 decreases correspondingly. Therefore, the voltage V2 generated by the transistor PO biased with the external resistance Rext increases as the impedance value of the transistor P0 decreases, and the control circuit 13 may thus determine the impedance value of the transistor P0 according to a level of the voltage V2.

Figure 1C:
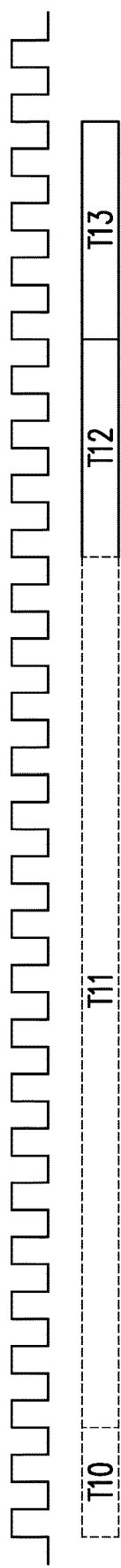
FIG. 1C is a schematic diagram of an operation cycle of an impedance calibration circuit according to an embodiment of the disclosure.

FIG. 1C is a schematic diagram of an operation cycle of the impedance calibration circuit 1 according to an embodiment of the disclosure. Specifically, in a time interval T10, the impedance calibration circuit 1 may perform a circuit configuration, and in a time interval T11, the impedance calibration circuit 1 may calibrate internal configuration parameters of the circuit (e.g., calibrate an offset of the comparators). In a time interval T12, the impedance calibration circuit 1 may perform a calibration operation for the calibration circuit 10, and in a time interval T13 subsequent to the time interval T12, the impedance calibration circuit 1 may perform a calibration operation for the calibration circuit 11.

In detail, in the time interval T12, the control circuit 13 first provides a predetermined control signal Vc1 to the calibration circuit 10, and adjusts the control signal Vc1 according to the biased voltage V1 generated by the calibration circuit 10 and the external resistance Rext. The impedance calibration circuit 1 first performs a calibration operation for the impedance values of the P-type metal-oxide-semiconductor (PMOS) transistors, so that the impedance value of the transistor P0 may be adjusted to be close to a predetermined impedance. Next, in the time interval T13, the adjusted control signal Vc1 is provided to the transistors P1 and P2 of the bias circuits 110 and 111 in the calibration circuit 11. The impedance calibration circuit 1 then performs a calibration operation for the impedance values of the N-type metal-oxide-semiconductor (NMOS) transistors, and adjusts the control signals Vc2 and Vc3 according to the voltages V2 and V3 generated by the calibration circuit 11, so that the impedance values of the transistors N1 and N2 may be adjusted to be close to the predetermined impedance. In short, in the time interval T12, the impedance calibration circuit 1 may calibrate the impedance values of the PMOS transistors in the calibration circuit 10 through the external resistance Rext to generate the control signal Vc1 adapted to calibrate the PMOS transistors. Next, in the time interval T13, the calibrated control signal Vc1 is provided to the P-type transistors P1 and P2 in the bias circuits 110 and 111 of the calibration circuit 11. The impedance calibration circuit 1 may perform a calibration operation for the calibration circuit 11 in the time interval T13 to generate the control signals Vc2 and Vc3 adapted to calibrate the NMOS transistors.

Figure 1D:
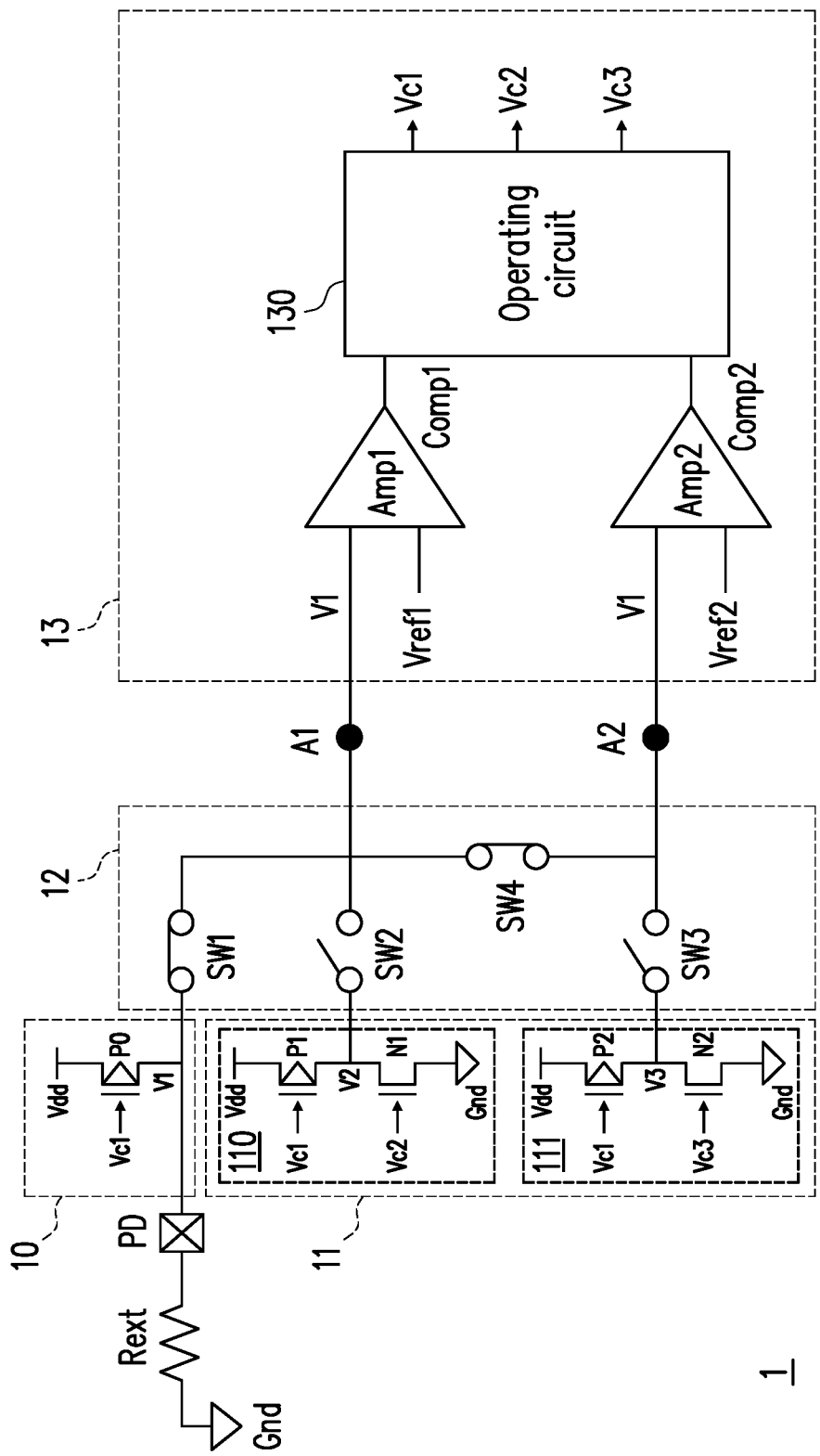
FIG. 1D to FIG. 1F are schematic diagrams of switching in a time interval by the impedance calibration circuit according to three different embodiments of the disclosure.

FIG. 1D is a schematic diagram of switching in the time interval T12 by the impedance calibration circuit 1 according to an embodiment of the disclosure. In the time interval T12, the impedance calibration circuit 1 may perform a calibration operation for the calibration circuit 10, and the switch circuit 12 may provide the voltage V1 to the nodes A1 and A2. Therefore, in the switch circuit 12, the switches SW1 and SW4 may be turned on, and the switches SW2 and SW3 may be turned off. The comparator Amp1 may receive the voltage V1 at the node A1 to compare with the reference signal Vref1, and the comparator Amp2 may receive the voltage V1 at the node A2 to compare with the reference signal Vref2. In one embodiment, the operating circuit 130 may adjust the control signal Vc1 and the reference signals Vref1 and Vref2 by a method of binary approximation to adjust the impedance value of the transistor P0 to be close to the predetermined impedance. For instance, the operating circuit 130 may first utilize the predetermined voltage of the control signal Vc1 (e.g., half the operating voltage Vdd) to configure the impedance value of the transistor P0 and generate the voltage V1, and then recursively adjust the control signal Vc1 and the reference signals Vref1 and Vref2 through comparing the voltage V1 with the reference signals Vref1 and Vref2, to further generate an appropriate control signal Vc1 in the time interval T12 to adjust the impedance value of the transistor P0. Therefore, in this embodiment, the control circuit 13 may perform a plurality of comparison operations at the same time in the time interval T12 to compare the comparison voltage V1 with a plurality of reference signals, i.e., the reference signals Vref1 and Vref2, which can reduce the cycles required for adjusting the impedance value of the transistor P0, and thus effectively increase the speed of the impedance calibration circuit 1.

Figure 1E:
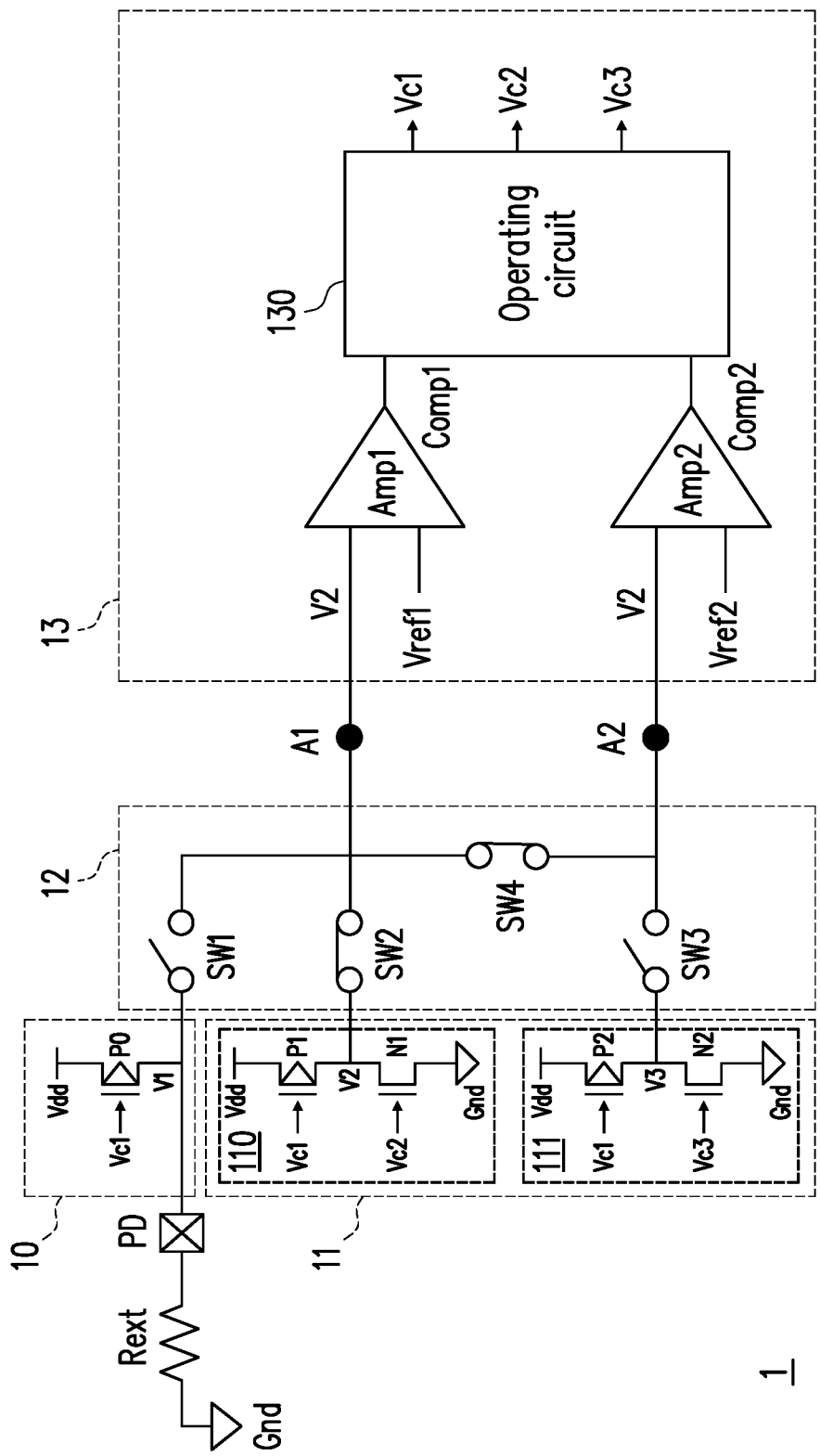

FIG. 1E is a schematic diagram of switching in the time interval T13 by the impedance calibration circuit 1 according to an embodiment of the disclosure. In this embodiment, the switch circuit 12 may transmit the voltage V2 to the nodes A1 and A2 in the time interval T13. Therefore, in the switch circuit 12, the switches SW2 and SW4 may be turned on, and the switches SW1 and SW3 may be turned off. The comparators Amp1 and Amp2 may receive the voltage V2 at the nodes A1 and A2, and the comparators Amp1 and Amp2 may compare the voltage V2 respectively with the reference signals Vref1 and Vref2. In this embodiment, the control circuit 13 may adjust the control signal Vc2 and the reference signals Vref1 and Vref2 utilizing a recursive comparison operation similar to the manner in which the transistor P0 is calibrated, to further generate the appropriate control signal Vc2 in the time interval T13 to adjust the impedance value of the transistor N1 to be close to the predetermined impedance. Therefore, in this embodiment, the control circuit 13 may perform a plurality of comparison operations at the same time in the time interval T13 to compare the voltage V2 generated by the bias circuit 110 in the calibration circuit 11 with a plurality of reference signals, i.e., the reference signals Vref1 and Vref2, which can reduce the cycles required for adjusting the impedance values of the transistors N1 and N2, and thus effectively increase the speed of the impedance calibration circuit 1.

Figure 1F:
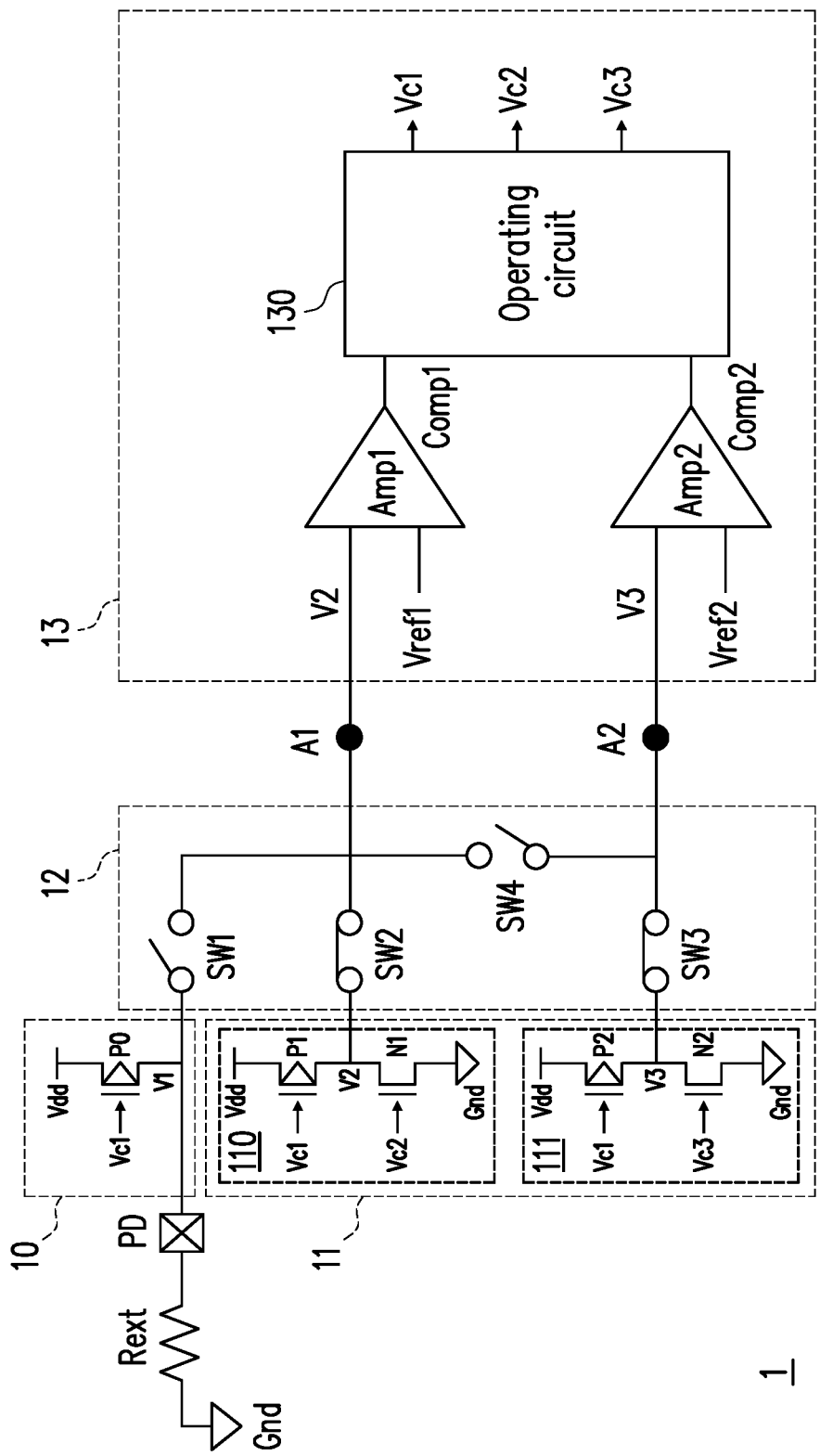

In addition, FIG. 1F is a schematic diagram of switching in the time interval T13 by the impedance calibration circuit 1 according to another embodiment of the disclosure. In this embodiment, the switch circuit 12 may transmit the voltage V2 to the node A1, and transmit the voltage V3 to the node A2 in the time interval T13. Therefore, in the switch circuit 12, the switches SW2 and SW3 may be turned on, and the switches SW1 and SW4 may be turned off. The comparator Amp1 may receive the voltage V2 to compare with the reference signal Vref1, and the comparator Amp2 may receive the voltage V3 to compare with the reference signal Vref2. At this time, the reference signals Vref1 and Vref2 received by the comparators Amp1 and Amp2 may be switched to a same voltage level to be compared with the voltages V2 and V3. In this embodiment, the control circuit 13 may utilize the predetermined control values Vc2 and Vc3 to configure the impedance values of the transistors N1 and N2 to generate the voltages V2 and V3. The control circuit 13 may then adjust the control signals Vc2 and Vc3 and the reference signals Vref1 and Vref2 through recursive comparison operations, to further generate the appropriate control signals Vc2 and Vc3 in the time interval T13 to adjust the impedance values of the transistors N1 and N2 to be close to the predetermined impedance. Therefore, in this embodiment, the control circuit 13 may perform a plurality of comparison operations at the same time in the time interval T13 to compare a plurality of voltages, i.e., the voltages V2 and V3, generated by the bias circuit 110 and the bias circuit 111 in the calibration circuit 11 with the reference signals Vref1 and Vref2 which are at the same level, which can effectively reduce the time for calibrating the impedance value.

Figure 2A:
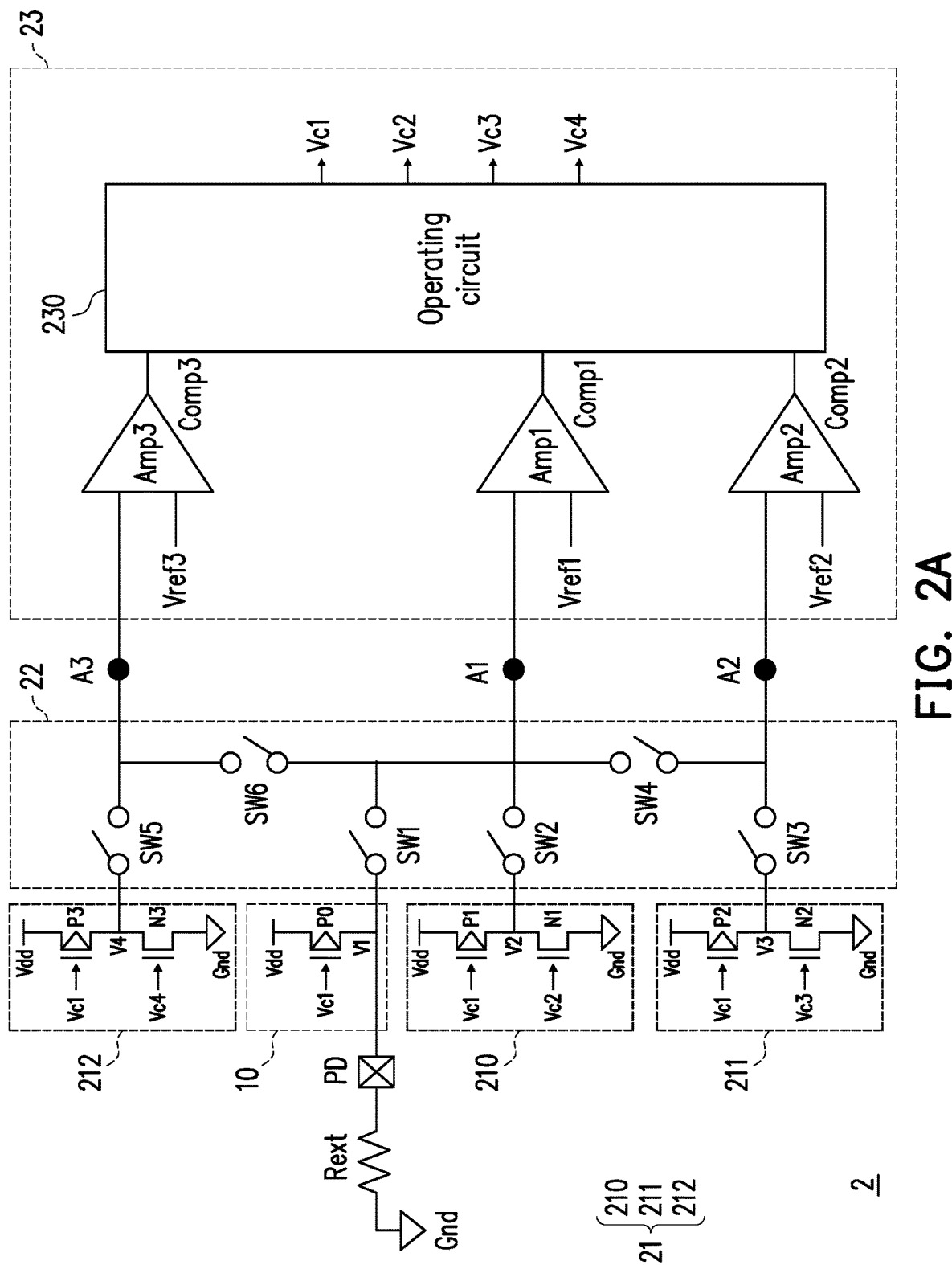
FIG. 2A is a schematic diagram of an impedance calibration circuit according to an embodiment of the disclosure.

FIG. 2A is a schematic diagram of an impedance calibration circuit 2 according to an embodiment of the disclosure. The difference between the impedance calibration circuit 2 and the impedance calibration circuit 1 is that a calibration circuit 21, a switch circuit 22 and a control circuit 23 in the impedance calibration circuit 2 respectively replace the calibration circuit 11, the switch circuit 12, and the control circuit 13 in the impedance calibration circuit 1. The impedance calibration circuit 2 includes the calibration circuits 10 and 21, the switch circuit 22, and the control circuit 23. The same elements in the impedance calibration circuit 2 and the impedance calibration circuit 1 are labeled with the same symbols. The related contents may therefore be referred to in the related paragraphs above.

In detail, the calibration circuit 21 includes the bias circuits 210, 211, and 212. The calibration circuit 21 may generate a voltage V4 through the bias circuit 212. The bias circuit 212 includes transistors P3 and N3. One terminal of the transistor P3 receives an operating voltage Vdd and another terminal is coupled to one terminal of the transistor N3. Another terminal of the transistor N3 receives a ground voltage Gnd. Control terminals of the transistors P3 and N3 respectively receive control signals Vc1 and Vc4 to adjust impedance values of the transistors P3 and N3. The transistors P3 and N3 may generate the voltage V4 through a node where the transistors P3 and N3 are coupled to each other.

The switch circuit 22 includes switches SW5 and SW6 in addition to the switches SW1 to SW4. The switch SW5 is coupled between the bias circuit 212 in the calibration circuit 21 and a node A3. The switch SW6 is coupled between the node A1 and the node A3.

The control circuit 23 includes comparators Amp1, Amp2, and Amp3, and an operating circuit 230. In the comparator Amp3, one input terminal is coupled to the node A3, another input terminal receives a reference signal Vref3, and a comparison result Comp3 of the two input terminals is generated at an output terminal. The operating circuit 230 receives the comparison results Comp1, Comp2, and Comp3 and may generate control signals Vc1, Vc2, Vc3, and Vc4 accordingly to adjust impedance values in the impedance calibration circuit 2.

Reference may be made to FIG. 1B and FIG. 2A together to understand the calibration processes of the impedance calibration circuit 2. Specifically, the impedance calibration circuit 2 may perform a configuration in a time interval T10 and calibrate configuration parameters in a time interval T11 (e.g., calibrate an offset of the comparators), perform a calibration operation for the calibration circuit 10 in a time interval T12 subsequent to the time interval T11, and perform a calibration operation for the calibration circuit 21 in a time interval T13 subsequent to the time interval T12. In detail, the impedance calibration circuit 2 may perform the calibration operation for the calibration circuit 10 according to an external resistance Rext in the time interval T12, to generate the control signal Vc1 adapted to calibrate the PMOS transistors. The P-type transistors P0, P1, P2 and P3 in the bias circuits 210, 211, and 212 may be configured according to the calibrated control signal Vc1. The impedance calibration circuit 2 may perform a calibration operation for the calibration circuit 21 in the time interval T13 subsequent to the time interval T12, to generate control signals Vc2, Vc3, and Vc4 adapted to calibrate the NMOS transistors.

Figure 2B:
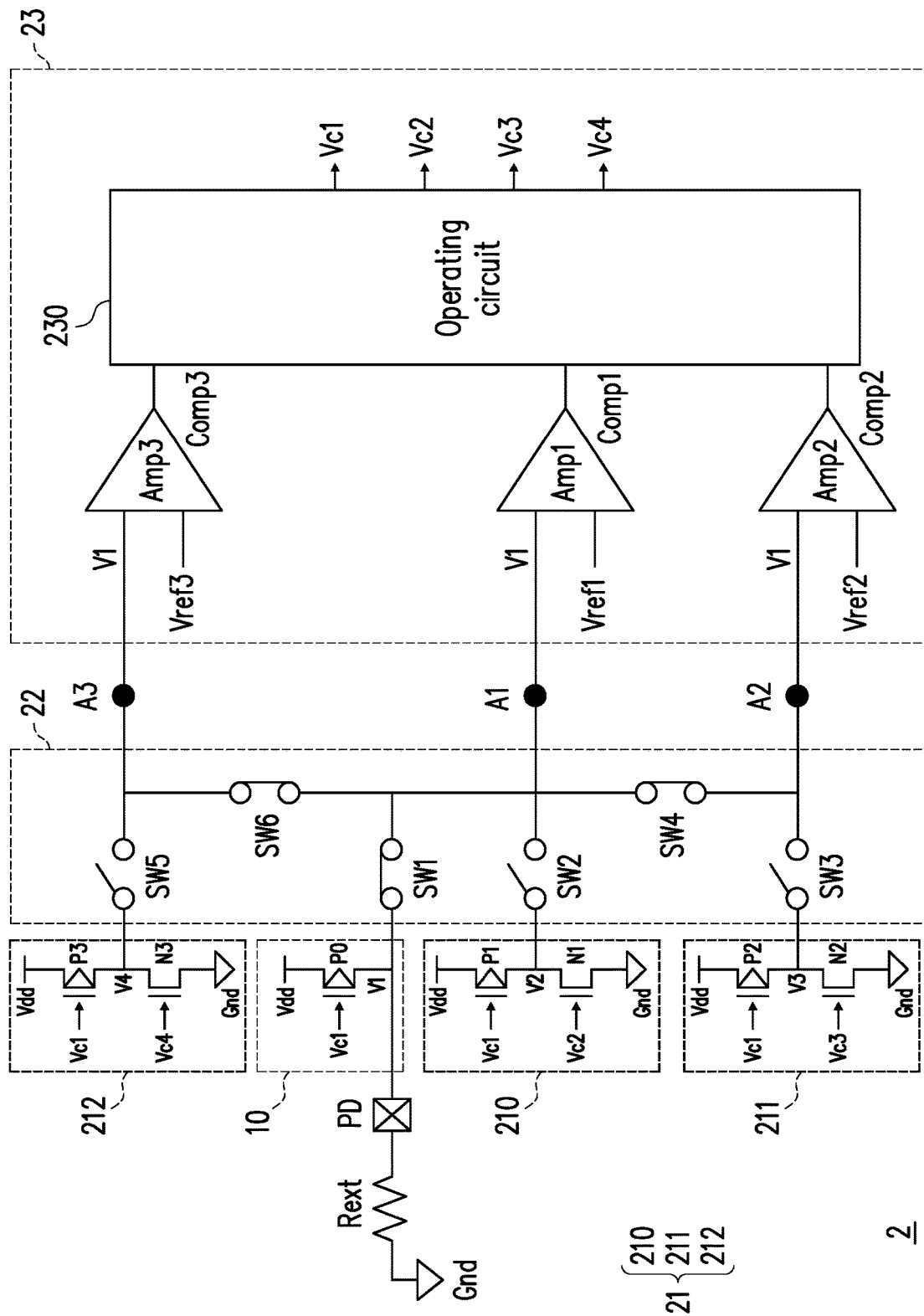
FIG. 2B to FIG. 2D are schematic diagrams of switching in a time interval by the impedance calibration circuit according to three different embodiments of the disclosure.

FIG. 2B is a schematic diagram of switching in the time interval T12 by the impedance calibration circuit 2 according to an embodiment of the disclosure. In the time interval T12, the impedance calibration circuit 2 may perform the calibration operation for the calibration circuit 10, and the switch circuit 22 may provide the voltage V1 to the nodes A1, A2 and A3. Therefore, in the switch circuit 12, the switches SW1, SW4, and SW6 may be turned on, and the switches SW2, SW3, and SW5 may be turned off. The comparators Amp1, Amp2, and Amp3 may receive the voltage V1 at respective receiving terminals through the nodes A1, A2 and A3, and compare respectively with the reference signals Vref1, Vref2 and Vref3, to thereby generate the comparison results Comp1, Comp2, and Comp3 and determine the control signal Vc1 through a method of recursive binary approximation.

Specifically, the control signal Vc1 in this embodiment may have six control bits, and in a first cycle of the time interval T12, the control circuit 23 may configure the control signal Vc1 as [100000], and may configure the reference signals Vref1, Vref2, and Vref3 provided to the comparators respectively as ¼Vdd, ½Vdd, and ¾Vdd. The first two bits of the control signal Vc1 are determined through the comparison results Comp1, Comp2, and Comp3 of the comparators Amp1 to Amp3 in the first cycle. Next, the reference signals Vref1, Vref2 and Vref3 are adjusted to corresponding voltage levels according to the determined first two bits of the control signal Vc1 to determine the subsequent two bits of the control signal Vc1. By recursively performing such operations, the impedance calibration circuit 2 only needs three cycles to accurately determine the six-bit control signal Vc1.

In addition, although not shown in FIG. 2B, after the time interval T12, the impedance calibration circuit 2 may additionally perform a fine-tuning comparison operation for the control signal Vc1 of the calibration circuit 11. In detail, the control circuit 23 may adjust the control signal Vc1 through the method of binary approximation, so that the impedance value of the transistor P0 approximates a target impedance value to be adjusted, until the target impedance value to be adjusted falls within a range between a binary value of the control signal Vc1 (e.g., [010010]) and the binary value of the control signal Vc1 added by one (e.g., [010011]). However, when adjusting the impedance value of the transistor P0, the control signal Vc1 in a digital form may be restricted by a resolution of the control signal Vc1, and may not determine whether the target impedance value is closer to the control signal Vc1, or closer to the binary value of the control signal Vc1 added by one. Therefore, the impedance calibration circuit 2 may further increase the accuracy of the impedance calibration circuit 2 through performing the additional fine-tuning comparison operation after the time interval T12.

In detail, the control circuit 23 may adjust the reference signals Vref1, Vref2, and Vref3 so that a difference between the three is half a minimum voltage resolution. For instance, the voltage of Vref1 may be configured as $Vdd/2-V_{LSB}/2$, the voltage of Vref2 may be configured as $Vdd/2$, and the voltage of Vref3 may be configured as $Vdd/2+V_{LSB}/2$. In this way, the control circuit 23 may adjust a least significant bit (LSB) of the control signal Vc1 through two additional cycles. In the first cycle, the control signal Vc1 is configured as the binary value generated in the time interval T12, and is compared with the reference signals Vref1, Vref2, and Vref3 whose resolutions are doubled. In the second cycle, the control signal Vc1 is configured as the binary value generated in time interval T12 added by one, and is compared with the reference signals Vref1, Vref2, Vref3 whose resolutions are doubled. Therefore, the control circuit 23 may configure the least significant bit of the control signal Vc1 more accurately through two additional cycles, so that the impedance value of the transistor P0 may be calibrated to be closer to the target impedance value.

Figure 2C:
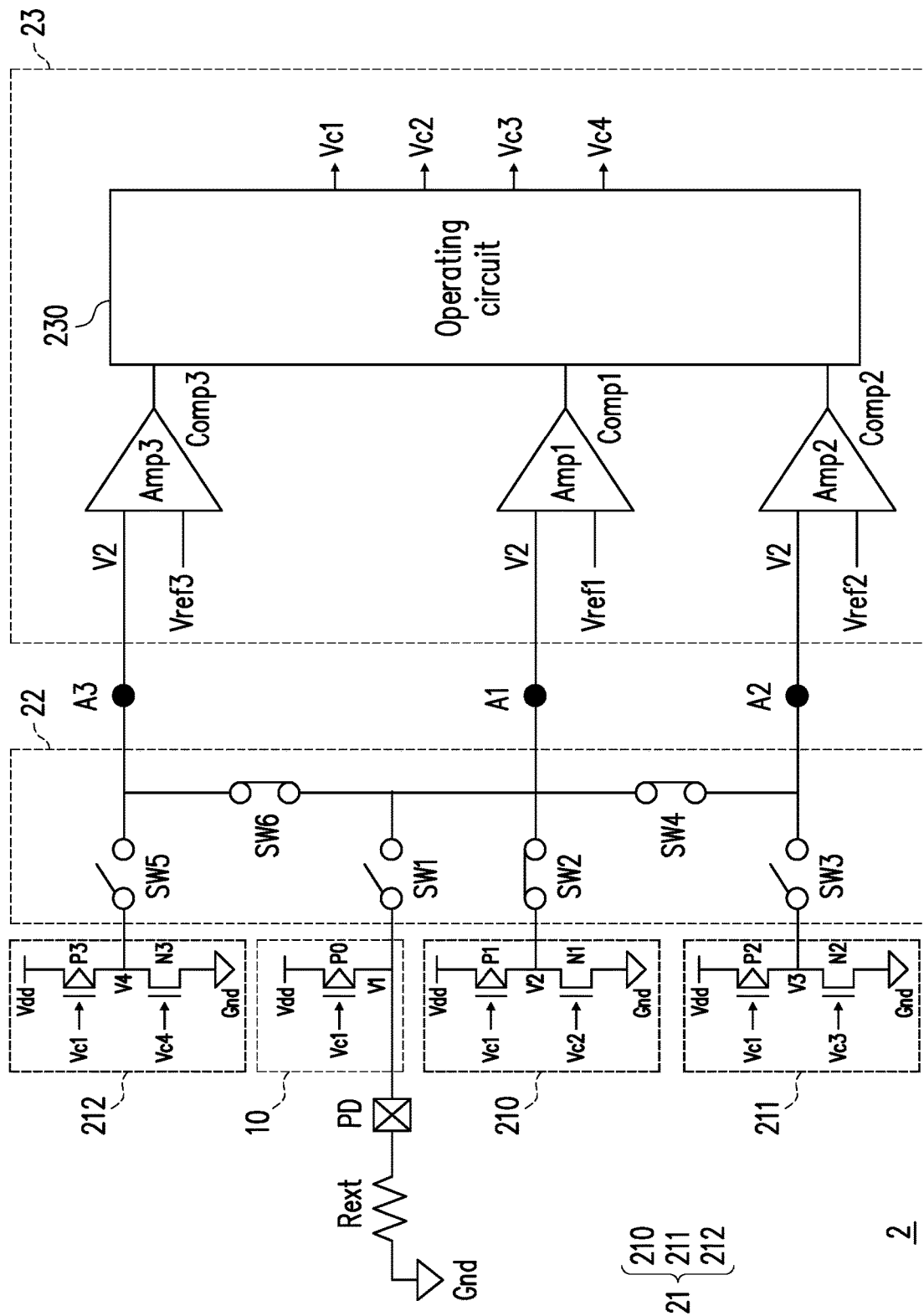

FIG. 2C is a schematic diagram of switching in the time interval T13 by the impedance calibration circuit 2 according to an embodiment of the disclosure. In the time interval T13, the impedance calibration circuit 2 may perform a calibration operation for the calibration circuit 21. The switch circuit 22 may provide the voltage V2 to the nodes A1, A2, and A3. Therefore, the switches SW2, SW4, and SW6 in the switch circuit 22 may be turned on, and the switches SW1, SW3, and SW5 may be turned off. The comparators Amp1, Amp2, and Amp3 may receive the voltage V2 at respective receiving terminals through the nodes A1, A2, and A3, and compare with the reference signals Vref1, Vref2, and Vref3 to further generate the comparison results Comp1, Comp2, and Comp3. The control circuit 23 may determine two bits of the control signal Vc2 during a comparison in each cycle through the method of binary approximation.

Specifically, a generation process of the control signal Vc2 is similar to the generation process of the control signal Vc1 in the foregoing paragraphs. In a first cycle of the time interval T13, the control circuit 23 may configure the control signal Vc2 as [100000]. The reference signals Vref1, Vref2, and Vref3 provided to the comparators may be configured respectively as ¼Vdd, ½Vdd, and ¾Vdd. The first two bits of the control signal Vc2 are determined through the comparison results Comp1, Comp2, and Comp3 of the comparators Amp1 to Amp3 in the first cycle. The reference signals Vref1, Vref2, and Vref3 are adjusted to corresponding voltage levels according to the determined first two bits of the control signal Vc2, to determine the subsequent two bits of the control signal Vc2. By recursively performing such operations, the impedance calibration circuit 2 only needs three cycles to accurately determine the six-bit control signal Vc2.

Figure 2D:
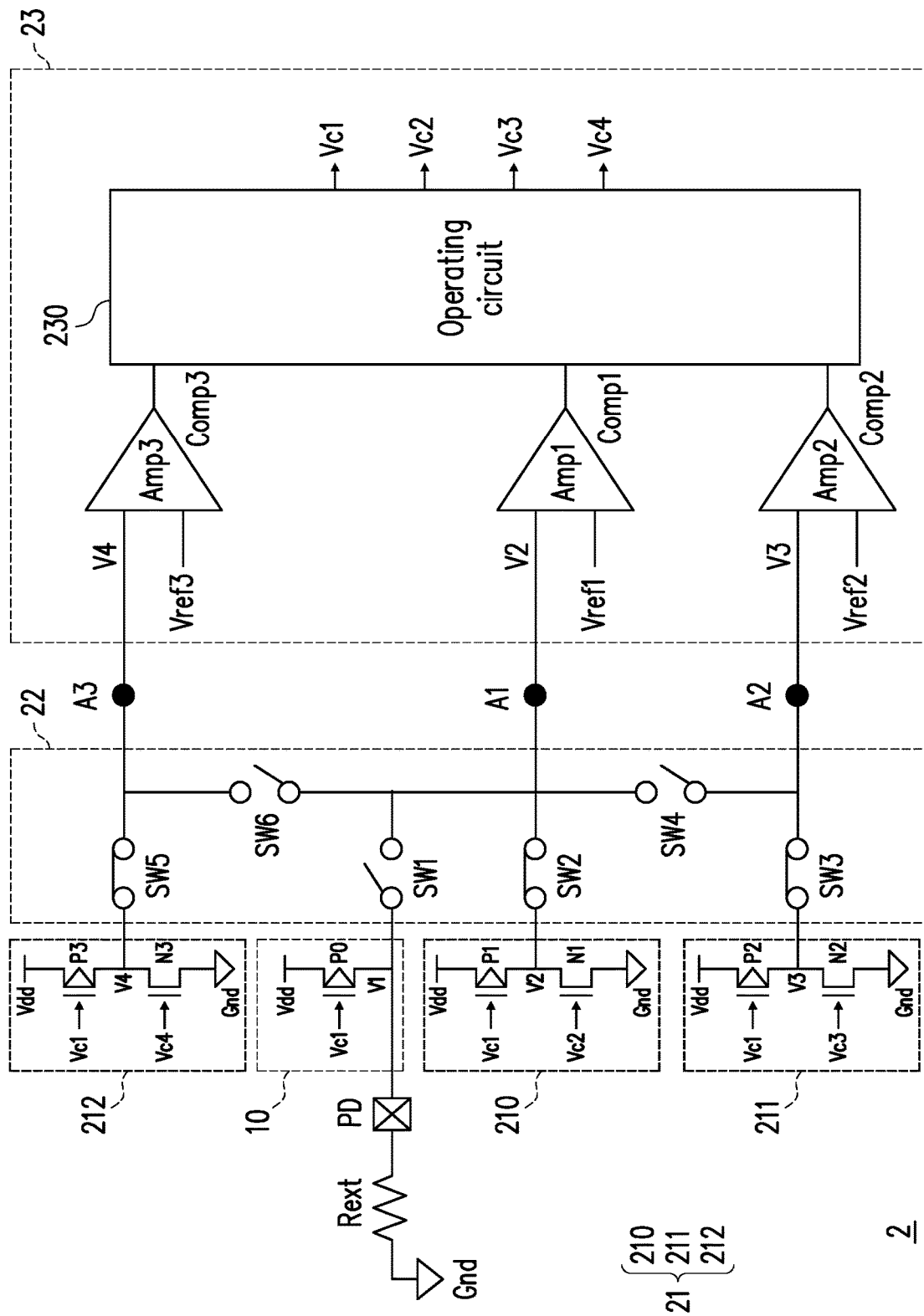

In addition, FIG. 2D is a schematic diagram of switching in the time interval T13 by the impedance calibration circuit 2 according to another embodiment of the disclosure. In this embodiment, the impedance calibration circuit 2 may perform a calibration operation for the calibration circuit 21. In this embodiment, the switch circuit 22 may transmit the voltage V2 to the node A1, the voltage V3 to the node A2, and the voltage V4 to the node A3. Therefore, the switches SW2, SW3, and SW5 in the switch circuit 22 may be turned on, and the switches SW1, SW4, and SW6 may be turned off. The comparator Amp1 may receive the voltage V2 to compare with the reference signal Vref1, the comparator Amp2 may receive the voltage V3 to compare with the reference signal Vref2, and the comparator Amp3 may receive the voltage V4 to compare with the reference signal Vref3. At this time, the reference signals Vref1, Vref2, and Vref3 received by the comparators Amp1, Amp2, and Amp3 may be switched to a same voltage level to be compared with the voltages V2, V3, and V4.

Specifically, in the first cycle of the time interval T13, the control circuit 23 may configure the control signals Vc2, Vc3, and Vc4 respectively as [010000], [100000], and [110000]. The reference signals Vref1, Vref2, and Vref3 provided to the comparators may all be configured as ½Vdd. First two bits of the control signals Vc2 to Vc4 are determined through the comparison results Comp1, Comp2, and Comp3 of the comparators Amp1 to Amp3 in the first cycle. Further, the reference signals Vref1, Vref2, and Vref3 are adjusted to corresponding voltage levels to determine subsequent two bits of the control signals Vc2 to Vc4. By recursively performing such operations, the impedance calibration circuit 2 only needs three cycles to accurately determine the six-bit control signals Vc2 to Vc4.

In summary of the foregoing, the impedance calibration circuit may perform a plurality of comparison operations at the same time through the operations of the calibration circuits, the switch circuit, and the operating circuit, which effectively increases the speed of calibrating the impedance values and the accuracy of calibration.

What is claimed is:

1. An impedance calibration circuit, comprising:
   a first calibration circuit adapted to be coupled to an external resistance through a pad and generating a first voltage according to a first control signal;
   a second calibration circuit generating a second voltage and a third voltage according to the first control signal, a second control signal, and a third control signal;
   a switch circuit coupled to the first calibration circuit and the second calibration circuit, wherein the switch circuit selectively provides the first voltage, the second voltage, and the third voltage to a first node and a second node; and
   a control circuit coupled to the switch circuit at the first node and the second node, wherein the control circuit performs comparisons of voltages of the first node and the second node respectively with a first reference signal and a second reference signal, and generates the first control signal, the second control signal, and the third control signal according to comparison results,
   wherein in a first time interval, the switch circuit provides the first voltage to the first node and the second node, and
   wherein in a second time interval, the switch circuit provides the second voltage to the first node and the second node, or provides the second voltage and the third voltage respectively to the first node and the second node.

2. The impedance calibration circuit according to claim 1, wherein the switch circuit first provides the first voltage to the first node and the second node, so that the control circuit compares the first voltage with voltages of the first reference signal and the second reference signal to generate the first control signal, and then provides the second voltage to the first node and the second node, so that the control circuit compares the second voltage with the voltages of the first reference signal and the second reference signal to generate the second control signal and the third control signal.

3. The impedance calibration circuit according to claim 1, wherein the switch circuit first provides the first voltage to the first node and the second node, so that the control circuit compares the first voltage with voltages of the first reference signal and the second reference signal to generate the first control signal, and then provides the second voltage and the third voltage to the first node and the second node, so that the control circuit compares the second voltage and the third voltage respectively with the voltages of the first reference signal and the second reference signal to generate the second control signal and the third control signal.

4. The impedance calibration circuit according to claim 1, wherein the first calibration circuit comprises a first transistor, wherein a first terminal of the first transistor receives an operating voltage, a second terminal of the first transistor is coupled to the pad, and a control terminal of the first transistor receives the first control signal to adjust an impedance value of the first transistor and generate the first voltage at the second terminal of the first transistor.

5. The impedance calibration circuit according to claim 1, wherein the second calibration circuit comprises:
   a first bias circuit comprising a first transistor and a second transistor, wherein a first terminal of the first transistor receives an operating voltage, a second terminal of the first transistor is coupled to a first terminal of the second transistor, a second terminal of the second transistor receives a ground voltage, and control terminals of the first transistor and the second transistor respectively receive the first control signal and a first sub-control signal of the second control signal; and
   a second bias circuit comprising a third transistor and a fourth transistor, wherein a first terminal of the third transistor receives the operating voltage, a second terminal of the third transistor is coupled to a first terminal of the fourth transistor, a second terminal of the fourth transistor receives the ground voltage, and control terminals of the third transistor and the fourth transistor respectively receive the first control signal and a second sub-control signal of the second control signal,
   wherein the first bias circuit generates the second voltage at the second terminal of the first transistor, and the second bias circuit generates the third voltage at the second terminal of the third transistor.

6. The impedance calibration circuit according to claim 5, wherein the switch circuit comprises:
   a first switch, wherein a first terminal of the first switch is coupled to the pad to receive the first voltage, and a second terminal of the first switch is coupled to the first node;
   a second switch, wherein a first terminal of the second switch is coupled to the first bias circuit to receive the second voltage, and a second terminal of the second switch is coupled to the first node;

a third switch, wherein a first terminal of the third switch is coupled to the second bias circuit to receive the third voltage, and a second terminal of the third switch is coupled to the second node; and a fourth switch, wherein a first terminal of the fourth switch is coupled to the first node, and a second terminal of the fourth switch is coupled to the second node.

7. The impedance calibration circuit according to claim 6, wherein when the switch circuit provides the first voltage to the first node and the second node, the first switch and the fourth switch are turned on, and the second switch and the third switch are turned off.

8. The impedance calibration circuit according to claim 6, wherein when the switch circuit provides the second voltage to the first node and the second node, the first switch and the third switch are turned off, and the second switch and the fourth switch are turned on.

9. The impedance calibration circuit according to claim 6, wherein when the switch circuit provides the second voltage and the third voltage respectively to the first node and the second node, the first switch and the fourth switch are turned off, and the second switch and the third switch are turned on.

10. The impedance calibration circuit according to claim 6, wherein the control circuit comprises:

a first comparator, wherein a first input terminal of the first comparator is coupled to the first node, and a second input terminal of the first comparator receives the first reference signal to generate a comparison result at an output terminal of the first comparator;

a second comparator, wherein a first input terminal of the second comparator is coupled to the second node, and a second input terminal of the second comparator receives the second reference signal to generate a comparison result at an output terminal of the second comparator; and an operating circuit coupled to the output terminals of the first comparator and the second comparator to generate the first control signal and the second control signal according to the comparison results of the first comparator and the second comparator.

11. The impedance calibration circuit according to claim 10, wherein the second calibration circuit further generates a fourth voltage according to a fourth control signal, and the second calibration circuit further comprises:

a third bias circuit comprising a fifth transistor and a sixth transistor, wherein a first terminal of the fifth transistor receives the operating voltage, a second terminal of the fifth transistor is coupled to a first terminal of the sixth transistor, a second terminal of the sixth transistor receives the ground voltage, and control terminals of the fifth transistor and the sixth transistor respectively receive the first control signal and the fourth control signal, wherein the third bias circuit generates the fourth voltage at the second terminal of the fifth transistor.

12. The impedance calibration circuit according to claim 11, wherein the switch circuit further comprises:

a fifth switch, wherein a first terminal of the fifth switch is coupled to the third bias circuit to receive the fourth voltage, and a second terminal of the fifth switch is coupled to a third node; and a sixth switch, wherein a first terminal of the sixth switch is coupled to the first node, and a second terminal of the sixth switch is coupled to the third node, wherein when the switch circuit provides the first voltage to the first node and the second node, the fifth switch is turned off, and the sixth switch is turned on, so that the switch circuit further provides the first voltage to the third node, wherein when the switch circuit provides the second voltage to the first node and the second node, the fifth switch is turned off, and the sixth switch is turned on, so that the switch circuit further provides the second voltage to the third node, and wherein when the switch circuit provides the second voltage and the third voltage respectively to the first node and the second node, the fifth switch is turned on, and the sixth switch is turned off, so that the switch circuit further provides the fourth voltage to the third node.

13. The impedance calibration circuit according to claim 12, wherein the control circuit is further coupled to the switch circuit at the third node, the control circuit compares a voltage of the third node with a third reference signal to generate the fourth control signal, and the control circuit further comprises:

a third comparator, wherein a first input terminal of the third comparator is coupled to the third node, a second input terminal of the third comparator receives the third reference signal, and an output terminal of the third comparator generates a comparison result, wherein the operating circuit is further coupled to the output terminal of the third comparator to generate the third control signal according to the comparison result of the third comparator.

14. The impedance calibration circuit according to claim 1, wherein the first time interval is prior to the second time interval.

* * * * *